US 6,396,710 B1

(12) United States Patent
Iwami et al.

(10) Patent No.: US 6,396,710 B1
(45) Date of Patent: May 28, 2002

(54) HIGH DENSITY INTERCONNECT MODULE

(75) Inventors: Craig Iwami, Dana Point; Jim K. Hall, deceased, late of Newport Beach, by Lisa Hall, legal representative; Brian R. Mulholland; Seth Greiner, both of Costa Mesa, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/570,258

(22) Filed: May 12, 2000

(51) Int. Cl.[7] ................................................. H05K 1/14
(52) U.S. Cl. ...................... 361/760; 361/792; 361/803; 174/250; 257/700
(58) Field of Search ................................ 361/760, 761, 361/762, 784, 803, 807, 792; 174/250, 255, 259, 260; 257/700

(56) References Cited

U.S. PATENT DOCUMENTS

| | | | | |
|---|---|---|---|---|
| 5,291,062 A | * | 3/1994 | Higgins, III | 257/698 |
| 5,477,933 A | * | 12/1995 | Nguyen | 174/262 |
| 5,479,319 A | * | 12/1995 | Werther | 361/784 |
| 5,615,477 A | * | 4/1997 | Sweitzer | 29/840 |
| 5,625,944 A | * | 5/1997 | Werther | 29/843 |
| 5,682,061 A | * | 10/1997 | Khandros et al. | 257/666 |
| 5,796,590 A | * | 8/1998 | Klein | 361/774 |
| 5,800,184 A | * | 9/1998 | Lopergolo et al. | 439/66 |
| 6,031,292 A | * | 2/2000 | Murakami et al. | 257/778 |
| 6,050,832 A | * | 4/2000 | Lee et al. | 439/91 |
| 6,264,476 B1 | * | 7/2001 | Li et al. | 439/66 |

FOREIGN PATENT DOCUMENTS

JP     405129373 A  *  5/1993
JP     410163367 A  *  6/1998

* cited by examiner

Primary Examiner—Jayprakash N. Gandhi
(74) Attorney, Agent, or Firm—Leonard A. Alkov; Glenn H. Lenzen, Jr.

(57) ABSTRACT

A cost-effective packaging system (10) for ultra high density input/output (integrated circuits (14). The packaging system includes a first circuit chip (14) that has a first pattern of contacts (16) distributed across a surface area of the chip (14). The first pattern of contacts (16) represents input/output connections (16). A three-dimensional circuit (18) is disposed spatially parallel with respect to the first circuit chip (14) and organizes the input/output connections (16) into a second pattern of contacts (24, 30) suitable for connection to a second circuit (22). In a specific embodiment, the three-dimensional circuit (18) is a double sided DECAL (18). The double-sided DECAL (18) includes a substrate (18) having a first circuit pattern (28) spatially parallel with a second circuit pattern (30) on or in the substrate (18). The first and second circuit patterns (28 and 30) are interconnected. The first circuit pattern (28) has a third pattern of contacts (16) coincident with the first pattern of contacts (16) on the first circuit chip (14). The first circuit pattern (28) and/or the second circuit pattern (30) are ball grid arrays or coaxial connector arrays. The second circuit (22) is disposed spatially parallel with respect to the three-dimensional circuit (18). The second circuit (22) is a ceramic or laminate interposer that facilitates further organization of the input/output connections (16, 24). The interposer (18) includes a ball grid array (24) or a coaxial connector grid array (18) to facilitate the organization. A z-axis adhesive (20) is disposed between the interposer (22) and the three-dimensional circuit (18). A non-hermetic sealer (12) disposed over the first circuit chip (14).

8 Claims, 1 Drawing Sheet

HIGH DENSITY INTERCONNECT MODULE

BACKGROUND OF THE INVENTION

1. Field of Invention

This invention relates to electronic packaging. Specifically, the present invention relates to systems and methods for packaging microprocessors with highdensity input/output connections in space limited applications.

2. Description of the Related Art

Integrated circuits having hundreds or thousands of input/output connections are used in a variety of demanding applications ranging from computer chips to telecommunications digital signal processors. Such applications typically require cost-effective and reliable integrated circuit packaging systems that can effectively accommodate large numbers of interconnections between integrated circuits or circuit boards. Efficient electronic packaging systems and methods for packaging integrated circuit chips are becoming increasingly important as integrated circuits become smaller and more complex.

A typical integrated circuit requires multiple input/output lines including power, ground, and signal lines. The lines are often directed to the periphery of the integrated circuit chip upon which the integrated circuit resides. Each line is connected to a separate bonding pad along the periphery of the integrated circuit chip to allow for wire bonding to other circuits in the system in which the integrated circuit is employed. However, space is limited along the one-dimensional edges of integrated circuit chips. The requirement for peripheral connections places design constraints on the integrated circuits, which may increase the cost of the circuits. In addition, in systems requiring multiple interconnected integrated circuit chips, the use of peripheral connections often dramatically increases the space required to accommodate the multiple chips, thereby increasing the size of the system. This is particularly problematic in applications such as cellular telephones and calculators where small circuit sizes are of paramount importance.

To overcome limitations with conventional peripheral circuit interconnection methods, methods that utilize the two-dimensional surface area of the integrated circuit chip are often employed. Such methods include ball grid array (BGA) and flip chip techniques. These connection methods typically involve the use of a substrate having several conductive bumps or balls that are connected to a circuit or array within or on the substrate. The array is designed to organize input/output lines into an appropriate pattern suitable for connection to other circuits in the system in which the integrated circuit is employed. The substrate is often placed beneath an integrated circuit chip. The integrated circuit chip has an integrated circuit on the top, and a pattern of contacts that extend through the integrated circuit chip to the bottom of the chip. The pattern of contacts coincides with the pattern of bumps on the associated flip chip or ball grid array. The flip chip is 'flipped' and aligned with the pattern of contacts on the underside of the integrated circuit.

Conventional packaging systems employing BGA or flip chip formats often have many drawbacks. For example, the BGA substrates often have low thermal conductivity. The low thermal conductivity decreases connection reliability due to differences in coefficients of thermal expansion between materials used for the balls and the integrated circuit contacts. The packaging systems often lack adaptability features that allow removal of integrated circuits and replacement with new integrated circuits with different contact patterns. As a result, the entire package is often discarded. In addition, due to design limitations inherent in a conventional BGA system, the packaging systems often have unnecessarily large footprints to minimize cross-talk between connections and accommodate high frequency operation.

Hence, a need exists in the art for a cost-effective and space-efficient packaging system and method for effectively accommodating integrated circuits requiring high-density interconnections to other circuits. There is a further need for a reliable packaging system that can withstand repeated temperature related stresses, can reliably accommodate high frequency signals, and that can be easily adjusted to accommodate new integrated circuits without requiring discarding of the electronic package.

SUMMARY OF THE INVENTION

The need in the art is addressed by the cost-effective electronics packaging system of the present invention. In the illustrative embodiment, the inventive system is adapted for use with an integrated circuits requiring ultra-high density input/output connections and includes a first circuit chip having a first pattern of contacts distributed across a surface area of the chip. The first pattern of contacts represents input/output connections. A three-dimensional circuit is disposed; spatially; parallel with respect to the first circuit chip for organizing the input/output connections into a second pattern of contacts suitable for connection to a second circuit.

In a specific embodiment, the three-dimensional circuit is a double sided DECAL. The double-sided DECAL includes a substrate having a first circuit pattern spatially parallel with a second circuit pattern on or in the substrate. The first and second circuit patterns are interconnected. The first circuit pattern has a third pattern of contacts coincident with the first pattern of contacts on the first circuit chip.

In the illustrative embodiment, the first circuit pattern and/or the second circuit pattern are ball grid arrays. The first circuit pattern and/or the second circuit pattern are coaxial connector grid arrays. The second circuit is disposed spatially parallel with respect to the three-dimensional circuit. The second circuit is a ceramic or laminate interposer that facilitates further organization of the input/output connections. The interposer includes a ball grid array or a coaxial connector grid array to facilitate the organization. A z-axis adhesive is disposed between the interposer and the three-dimensional circuit. A non-hermetic sealer disposed over the first circuit chip.

DESCRIPTION OF THE INVENTION

Figure 1:
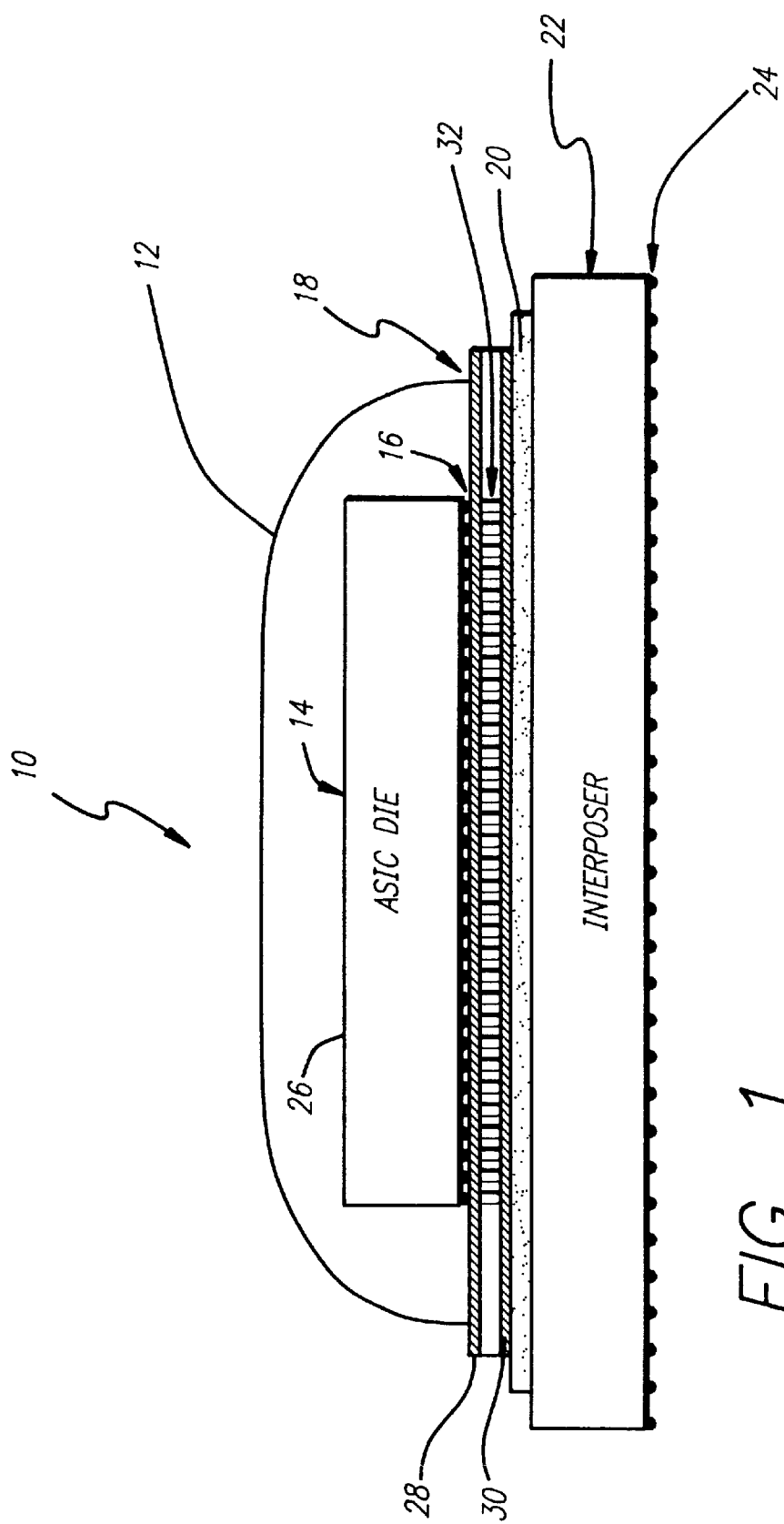
FIG. 1 is a diagram of a packaging system constructed in accordance with the teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

FIG. 1 is a diagram of a packaging system 10 constructed in accordance with the teachings of the present invention. The packaging system 10 includes, from top to bottom, an encapsulant sealer 12, an application specific integrated circuit (ASIC) die or chip 14, a first array of input/output contacts 16, a double-sided DECAL 18, a z-axis adhesive 20, an interposer 22, and a second array of input/output contacts 24.

The encapsulant sealer 12 is a non-non-hermetic and is made of plastic in the present specific embodiment. The ASIC die 14 is an integrated circuit chip that has an integrated circuit (not shown) disposed on a first face 26. The ASIC die 14 has multiple input/output lines (not shown) disposed vertically within the die that connect input/output signal paths within the integrated circuit to the first array of input/output contacts 16. The first array of input/output contacts 16 is patterned to match the input/output lines of the integrated circuit disposed on the first surface 26. The first array of input/output contacts 16 form electrical connections with a first interposer circuit 28 disposed on one surface of the double-sided DECAL 18. The first circuit 28 is designed to organize input/output lines corresponding to the first array of input/output contacts 16 into a predetermined arrangement. The first interposer circuit 28 is connected to a second circuit 30 disposed on an opposite face of the double-sided DECAL 16 via multiple vertical electrical lines 32 extending from the first circuit 28 to the second circuit 30. The second circuit 30 organizes the input/output lines from the first circuit into a second predetermined arrangement and provides this arrangement to an interposer 22 via multiple vertical lines (not shown) extending through the x-axis adhesive 20.

The interposer 22 contains an interposer circuit (not shown) that further organizes the multiple vertical lines into a third predetermined arrangement corresponding to the second array of input/output contacts 24.

Those skilled in the art will appreciate that the double-sided DECAL 18 acts as a double-sided interposer to facilitate the distribution of input/output lines in a minimum amount of space.

The packaging system 10 is constructed in accordance with standard surface mount technology (SMT) procedures well known in the art. The first and second arrays of input/output contacts, 16 and 24, respectively, are constructed in accordance with standard high-density-multi-chip-interconnect (HDMI) technology and are ball grid arrays (BGA) or coaxial connector gird arrays (CCGA) in the present specific embodiment. The dielectric constants of non-conducting materials are chosen to be in the range of 3 and 4 to minimize cross-talk between conductors.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. An interconnect module for electrically connecting a first structure having a first array of contacts arranged in accordance with a first design to a second structure having a second array of electrical contacts arranged in accordance with a second design, said interconnect module comprising:

an intermediate structure having a first surface on a first side thereof and a second surface-on a second side thereof;

a third array of electrical contacts disposed on said first surface of said intermediate structure and arranged in accordance with said first design to provide electrical connectivity with said first array of contacts;

a fourth array of electrical contacts disposed on said second surface of said intermediate structure and arranged in accordance with said second design to provide electrical connectivity with said second array of contacts; and an electrical circuit connecting selective contacts in said third array to respective contacts in said fourth array.

2. The invention of claim 1 wherein said intermediate structure includes a double-sided direct electrical contact array laminate.

3. The invention of claim 2 wherein said third array of electrical contacts is disposed on a first surface of said double-sided direct electrical contact array laminate.

4. The invention of claim 3 wherein said intermediate structure further includes an interposer mounted whereby a first surface of said interposer interfaces with a second surface of said double-sided direct electrical contact array laminate.

5. The invention of claim 4 wherein said fourth array of electrical contacts is disposed on a second surface of said interposer.

6. The invention of claim 5 wherein said electrical circuit extends through said double-sided direct electrical contact array laminate and said interposer.

7. The invention of claim 1 wherein said first structure is an integrated circuit.

8. The invention of claim 1 wherein said second structure is a wiring board.

* * * * *